United States Patent [19]
Taguchi

[11] Patent Number: 5,949,512
[45] Date of Patent: Sep. 7, 1999

[54] MOUNTED SUBSTRATE

[75] Inventor: Toshimichi Taguchi, Osaka, Japan

[73] Assignee: Sharp Kabushiki Kaisha, Osaka, Japan

[21] Appl. No.: 08/609,428

[22] Filed: Mar. 1, 1996

[30] Foreign Application Priority Data

Mar. 3, 1995 [JP] Japan .................................. 7-044646

[51] Int. Cl.$^6$ .................................................. G02F 1/133
[52] U.S. Cl. .......................................... 349/150; 349/149
[58] Field of Search .................................... 349/149, 150, 349/151, 152; 361/749, 807, 808, 809, 810; 345/206; 439/67; 174/254, 260

[56] References Cited

U.S. PATENT DOCUMENTS

| | | | |
|---|---|---|---|
| 5,089,750 | 2/1992 | Hatada et al. | 349/152 |
| 5,161,009 | 11/1992 | Tanoi et al. | 349/150 |
| 5,404,239 | 4/1995 | Hirai | 349/150 |
| 5,719,752 | 2/1998 | Mori et al. | 349/149 |

FOREIGN PATENT DOCUMENTS

| | | |
|---|---|---|
| 430741 | 5/1992 | Japan . |
| 533009 | 8/1993 | Japan . |

*Primary Examiner*—William L. Sikes
*Assistant Examiner*—Tai V. Duong

[57] ABSTRACT

A mounted substrate is a TCP of high definition and multi-output used in connection with a liquid crystal display panel of high definition and a great number of pixels. The TCP has a base film in whose aperture an LSI chip is installed. On the back surface of the base film, input and output wiring patterns are provided. A stress-absorbing portion is provided in the neighborhood of the LSI chip on an input-terminal side to be orthogonal to the input wiring patterns. The stress-absorbing portion absorbs a stress which occurs upon connecting a PWB and the input terminal of the TCP by a heating-and-pressurizing connection method. Therefore, it is possible by utilizing the TCP to obtain a thin liquid crystal module of high definition and a great number of pixels and with a high ratio of an available display area.

15 Claims, 18 Drawing Sheets

INPUT-TERMINAL FORMING AREA    OUTPUT-TERMINAL FORMING AREA

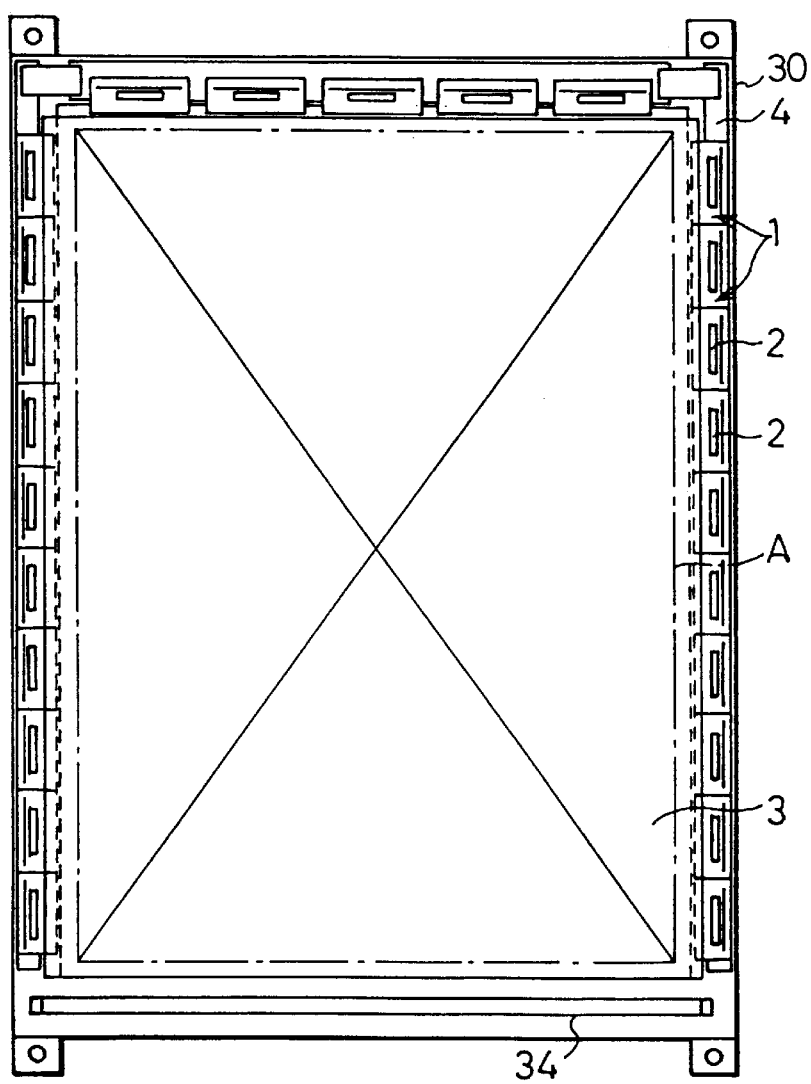

INPUT-TERMINAL FORMING AREA | OUTPUT-TERMINAL FORMING AREA

INPUT-TERMINAL FORMING AREA | OUTPUT-TERMINAL FORMING AREA

INPUT-TERMINAL FORMING AREA

OUTPUT-TERMINAL FORMING AREA

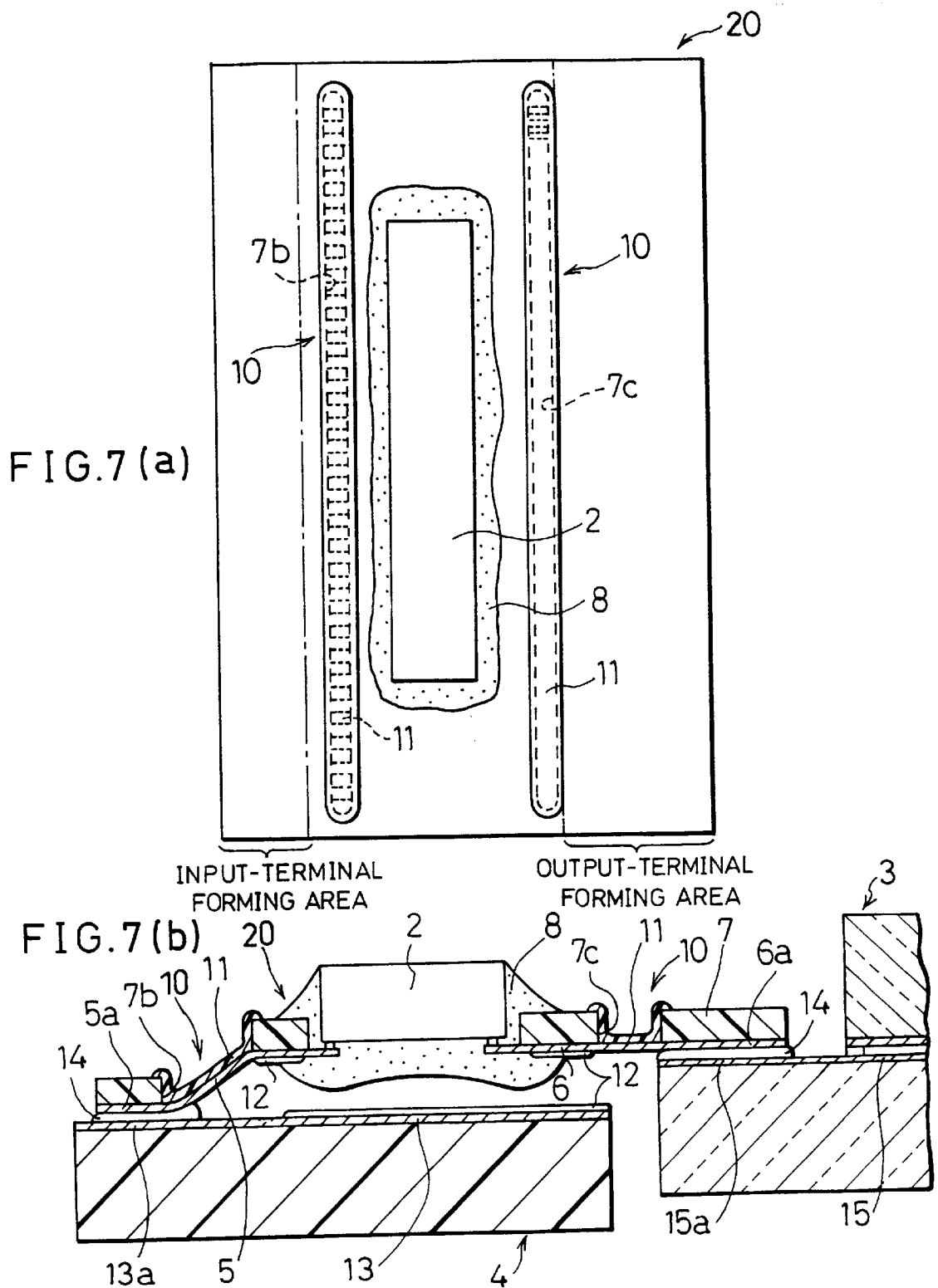

INPUT-TERMINAL
FORMING AREA

OUTPUT-TERMINAL
FORMING AREA

INPUT-TERMINAL FORMING AREA

OUTPUT-TERMINAL FORMING AREA

INPUT-TERMINAL FORMING AREA    OUTPUT-TERMINAL FORMING AREA

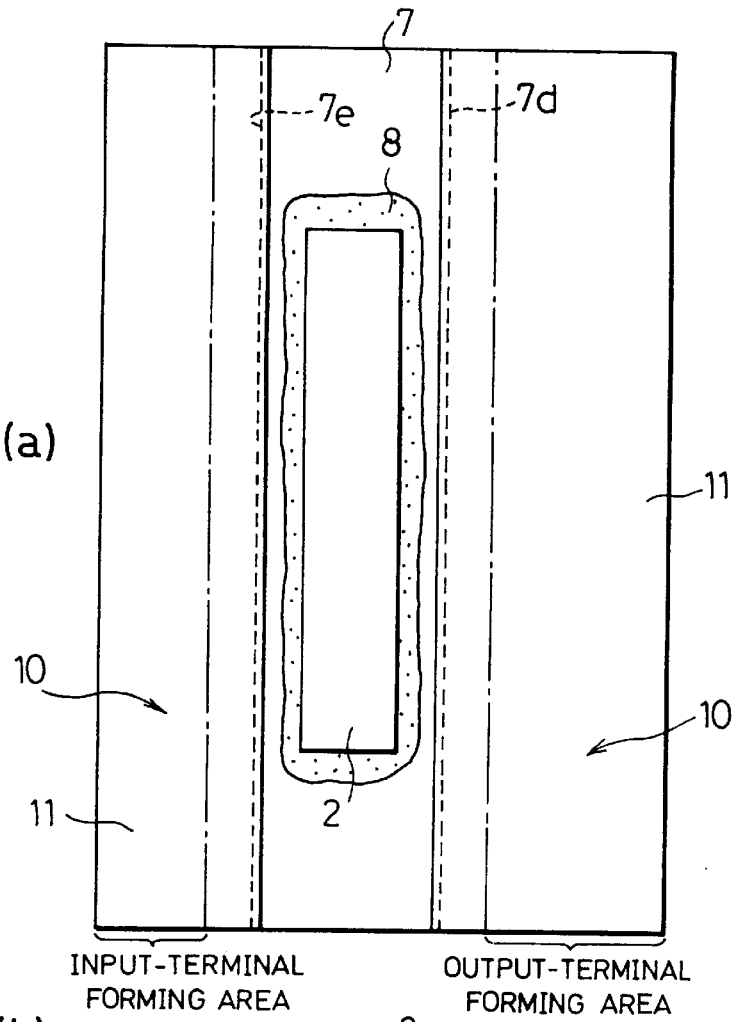
F I G. 14(a)
INPUT-TERMINAL FORMING AREA | OUTPUT-TERMINAL FORMING AREA
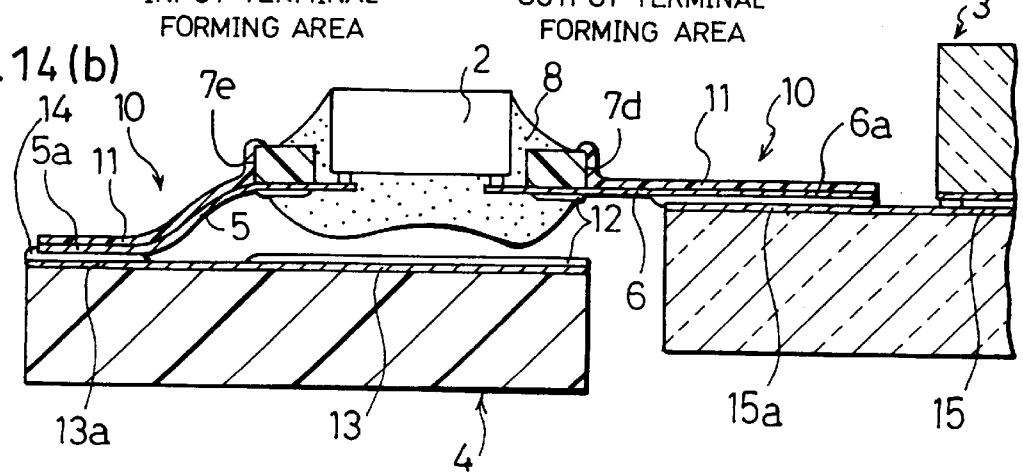
F I G. 14(b)

INPUT-TERMINAL FORMING AREA    OUTPUT-TERMINAL FORMING AREA

MOUNTED SUBSTRATE

FIELD OF THE INVENTION

The present invention relates to a mounted substrate, such as a TAB (Tape Automated Bonding) film carrier and a TCP (Tape Carrier Package), having a drive element, such as an IC (Integrated Circuit) and an LSI (Large Scale Integrated Circuit), for driving a flat display of, for example, a liquid crystal display, and more particularly, relates to a mounted substrate, provided without being folded between a flat display and a wiring board, capable of connecting the flat display and the wiring board so as to virtually form one flat plane.

BACKGROUND OF THE INVENTION

Recently a liquid crystal display panel, a kind of flat display, has been widely used as a display of a lap-top word processor and an electronic pocketbook.

As shown n FIGS. 16(a) and 16(b), in a liquid crystal module adopting the above liquid crystal display panel, TCPs 63 with drive IC chips 62 thereon are used in connecting a liquid crystal display panel 61 and the IC chips 62 for driving the liquid crystal display panel 61. Each of the TCPs 63 is connected to a PWB (Printed Wiring Board) 64. The liquid crystal display panel 61, the TCP 63 and the PWB 64 are, as shown in FIG. 17, connected so as to virtually form one flat plane. FIG. 17 is an enlarged cross-sectional view of the area enclosed with a circle in FIG. 16(a). Referring to FIGS. 16(a), 16(b), and 17, the member 80 is a bezel case; the member 81 is a plastic chassis; the member 82 is a light guiding plate of a backlight; the member 83 is a spacer; the member 84 is a cold cathode tube for the backlight.

The TCP 63, as shown in FIG. 18(a), has a base film 67 made of flat insulating resin having a device installment aperture 67a in the center thereof. The IC chip 62 is fixed to the device installment aperture 67a by resin mold 68. Input wiring patterns 65 and output wiring patterns 66 are provided on the back surface of the base film 67. An end of each input wiring pattern 65 is connected to each terminal of the IC chip 62, while the other end of each input wiring pattern 65, extending to the left in FIG. 18(a), has an input terminal 65a. An end of each output wiring pattern 66 is connected to each terminal of the IC chip 62, while the other end of each output wiring pattern 66, extending to the right in FIG. 18(a), has an output terminal 66a.

FIG. 18(b) is a cross-sectional view showing the liquid crystal display panel 61 and the PWB 64 connected to each other. Each of the input terminals 65a of the TCP 63 is connected through an ACF (Anisotropic Conductive Film) 69 to each of output terminals 70a provided on an end of each of electrode patterns 70. Each of the output terminals 66a of the TCP 63 is connected through the ACF 69 to each of input terminals 71a provided on an end of each of electrode patterns 71. Solder resist 72 is applied to parts of the input and output wiring patterns 65 and 66 where insulation is necessary.

In a liquid crystal module utilizing such a liquid crystal display panel as the liquid crystal display panel 61, ratio of available display area to the whole front surface should be great in order to improve portability and make dimensions scaled down. Referring to FIG. 16(b), the ratio of the area enclosed with alternate long and short dash lines A should be great.

One of the improvements achieved so far to increase the area ratio is to use slim drive electronic parts around the liquid crystal display panel in order to reduce space necessary to accommodate the drive electronic parts (a first conventional method). For example, size of a TCP have been reduced by shortening distances between its input terminals and output terminals. Size of a PWB have been reduced by reducing its width.

Another method is to carve a part of a TCP. The carved TCP is more flexible and therefore can be bent so that the drive electronic parts including a PWB can be provided on the back surface of the panel (a second conventional method).

Recently, as improvements on definition and pixels are achieved with a liquid crystal display panel, especially with a color liquid crystal display panel. Therefore, there is demand for a TCP of high definition and multi-output in accordance with the improvements on definition and pixels.

However, when a conventional TCP of high definition and multi-output is made slim according to the first conventional method in order to increase the area ratio of the available display area, the following problems occurs.

As shown in FIG. 19(a), when an ACF is used to connect an input terminal of a slim TCP 73 and an output terminal of the PWB 64 in a heating-and-pressurization connecting process, an area which is on the input-terminal side of the TCP 73 and in the neighborhood of the resin mold 68 fixing the IC chip 62 is heated and pressurized. Accordingly, the base film 67 is pulled towards the input terminal which causes a stress within the TCP 73. The base film 67 therefore induces the resin mold 68 to peel at an interface thereof and also induces a copper-foil inner lead to be cut off. The inner lead refers to an inner lead connected to the terminal of the IC chip 62 sticking out in the device installment aperture.

Moreover, in the connecting process, the PWB 64, being still hot and expanded, is attached to the TCP 73 which has been already connected and fixed to the liquid crystal display panel 61. Therefore, when the heating connection process is over and the PWB 64 is cooled down to a room temperature, the PWB 64 is bent in accordance with contraction of the PWB 64 as shown in FIG. 19(b). When the ACF is used in the connection, the contraction of the PWB 64 varies depending on the thermal contraction factor of the PWB 64 in a temperature zone between the Tg (the transition point of the ACF to the glass phase) and an ordinary temperature. When solder is used for the connecting, the contraction of the PWB 64 varies depending on the thermal contraction factor of the PWB 64 in a temperature difference between the freezing point of the solder and an ordinary temperature.

The bent PWB 64 distorts a portion of the TCP 73 as indicated as P in FIG. 19(a). The distorted portion P may twist or even cut off the input wiring pattern 65 made of conductor, such as copper foil.

The slim and narrow TCP 73 cannot absorb the stress caused by the bent PWB 64. As a result, the output side of the TCP 73 is pressed against a glass edge of the liquid crystal display panel 61. And an output terminal of the TCP 73 may be cut off by the glass edge.

The TCP of high definition and multi-output is weak in structure because the wiring pitch thereof is narrow and the cross-sectional area of the input and output wiring patterns thereof is small. Therefore, the above problems occur more often with this type of TCP. And the first conventional method which only reduces the size of the TCP cannot make a slimmer and narrower TCP of high definition and multi-output.

Accordingly, the second conventional method, in which the TCP is bent, was employed to increase the ratio of the available display area to the whole front surface of the module. The second conventional method can surely increase the area ratio. However, the second conventional method has a disadvantage in that the bent TCP makes the liquid crystal module thick in size. Since it is important for the liquid crystal module to be thin as well as to achieve a high area ratio of the available display area, it is not preferable to employ the bent TCP.

Consequently, it was impossible to obtain with the conventional methods a thin liquid crystal module of high definition and a great number of pixels and with a high area ratio of available display area. Thus, there is a big demand for improvements on the structure of the TCP which make it possible to obtain a slim TCP of high definition and multi-output.

SUMMARY OF THE INVENTION

In view of the above problems, an object of the present invention is to provide a slim mounted substrate of high definition and multi-output.

A mounted substrate provided without being folded between a flat display and a wiring board in accordance with the present invention has:

- a flexible insulating board, provided on one surface thereof with wiring patterns for connecting terminals of a drive element to terminals of the flat display and terminals of the wiring board, having an aperture for installment of the drive element; and
- a stress-absorbing portion more flexible than said insulating board, provided to be substantially orthogonal to the wiring patterns between a neighborhood of the drive element and an edge of said insulating board connected to the wiring board and/or between a neighborhood of the drive element and an edge of said insulating board connected to the flat display, for absorbing stress caused by a connection of the drive element to the flat display and the wiring board.

The mounted substrate has the stress-absorbing portion which is more flexible than the insulating board and extends almost orthogonal to the wiring patterns between the neighborhood of the drive element and the edge(s) of the insulating board on the side(s) where terminals of wiring patterns are provided. Therefore, the stress-absorbing portion absorbs stress caused by a heating-and-pressurizing connection.

The stress-absorbing portion is preferably provided at least between the neighborhood of the drive element and the edge of the insulating board on the side connected to the wiring board. With the arrangement, even if the wiring board is bent in accordance with contraction of the wiring board and causes a stress which may distort and deform the mounted substrate when the wiring board and the input-side of the mounted substrate are connected by the heating-and-pressurizing connection, the stress is absorbed by the stress-absorbing portion.

Consequently, the mounted substrate is neither distorted nor deformed by the stress. It is thus possible to prevent the input-side wiring patterns from being cut off or twisted. Moreover, the output terminals of the mounted substrate connected to the flat display, e.g. a liquid crystal display panel, is not pressed against a glass edge of the liquid crystal display panel. It is thus possible to prevent the output terminals of the mounted substrate from being cut off by the glass edge.

When the wiring board is connected to the input-terminal side of the mounted substrate by heating and pressurizing, it is possible to treat the insulating board as two portions separated by the stress-absorbing portion: namely, the drive-element side and the input-terminal side. As a result, heating the neighborhood of the drive element causes no stress pulling the drive-element side of the insulating board towards the input-terminal side thereof. Thus, resin mold fixing the drive element to the insulating board is prevented from peel at an interface thereof, and an inner lead is prevented from being cut off.

The mounted substrate can, as described so far, solve problems presented by a conventional slim mounted substrate of high definition and multi-output which is weak in structure because such a mounted substrate has a narrow wiring pitch and a small cross-sectional area of the input and output wiring patterns. Thus it is possible to provide a slim mounted substrate of high definition and multi-output which realizes a thin liquid crystal module of high definition and a great number of pixels and with a high ratio of an available display area.

The stress-absorbing portion is, preferably, composed of wiring patterns coated with protection resin. A part of the insulating board is cut out in order to expose the wiring patterns. At least one of the surfaces of the wiring patterns is coated with protection resin which is able to absorb the stress caused by the heating and pressurizing. Alternatively, the stress-absorbing portion is, preferably, an etched part of the insulating board. The etched part is provided by etching the other surface of the insulating board so that the etched part is thinner than the unetched part. These arrangements make it easy to provide the stress-absorbing portion and to obtain the mounted substrate having the above effects.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention will become more fully understood from the detailed description given hereinbelow and the accompanying drawings which are given by way of illustration only, are not in any way intended to limit the scope of the claims of the present invention.

BRIEF DESCRIPTION OF THE DRAWINGS

FIG. 1(a) is a plan view showing the tape carrier package, and FIG. 1(b) is a cross-sectional view showing the tape carrier package connected to both a liquid crystal display panel and a print wiring board.

FIGS. 2(a) and 2(b) are, respectively, a side view and a plan view showing a liquid crystal module including a liquid crystal display panel connected to the tape carrier package.

FIG. 4(a) is a plan view showing the tape carrier package, and FIG. 4(b) is a cross-sectional view showing the tape carrier package connected to both a liquid crystal display panel and a print wiring board.

FIG. 5(a) is a plan view showing the tape carrier package, and FIG. 5(b) is a cross-sectional view showing the tape carrier package connected to both a liquid crystal display panel and a print wiring board.

FIG. 6(a) is a plan view showing the tape carrier package, and FIG. 6(b) is a cross-sectional view showing the tape carrier package connected to both a liquid crystal display panel and a print wiring board.

FIGS. 7(a) and 7(b) referring to a tape carrier package of a still further embodiment in accordance with the present invention, FIG. 7(a) is a plan view showing the tape carrier package, and FIG. 7(b) is a cross-sectional view showing the tape carrier package connected to both a liquid crystal display panel and a print wiring board.

FIG. 9(a) is a plan view showing the tape carrier package, and FIG. 9(b) is a cross-sectional view showing the tape carrier package connected to both a liquid crystal display panel and a print wiring board.

FIG. 10(a) is a plan view showing the tape carrier package, and FIG. 10(b) is a cross-sectional view showing the tape carrier package connected to both a liquid crystal display panel and a print wiring board.

FIG. 13(a) is a plan view showing the tape carrier package, and FIG. 13(b) is a cross-sectional view showing the tape carrier package connected to both a liquid crystal display panel and a print wiring board.

FIGS. 14(a) and 14(b) referring to a tape carrier package of a still further embodiment in accordance with the present invention, FIG. 14(a) is a plan view showing the tape carrier package, and FIG. 14(b) is a cross-sectional view showing the tape carrier package connected to both a liquid crystal display panel and a print wiring board.

FIG. 15(a) is a plan view showing the tape carrier package, and FIG. 15(b) is a cross-sectional view showing the tape carrier package connected to both a liquid crystal display panel and a print wiring board.

FIG. 18(a) is a plan view showing the tape carrier package, and

FIG. 18(b) is a cross-sectional view showing the tape carrier package connected to both a liquid crystal display panel and a print wiring board.

DESCRIPTION OF THE EMBODIMENTS

FIRST EMBODIMENT

Referring to FIGS. 1 through 6, the following description will discuss an embodiment in accordance with the present invention.

A TCP (a mounted substrate) in accordance with the present invention is a slim TCP of high definition and multi-output which connects a liquid crystal display panel (a flat display) of high definition and a great number of pixels to an LSI chip for driving the liquid crystal display panel, which, as a whole, forms a liquid crystal module.

Figure 1A:
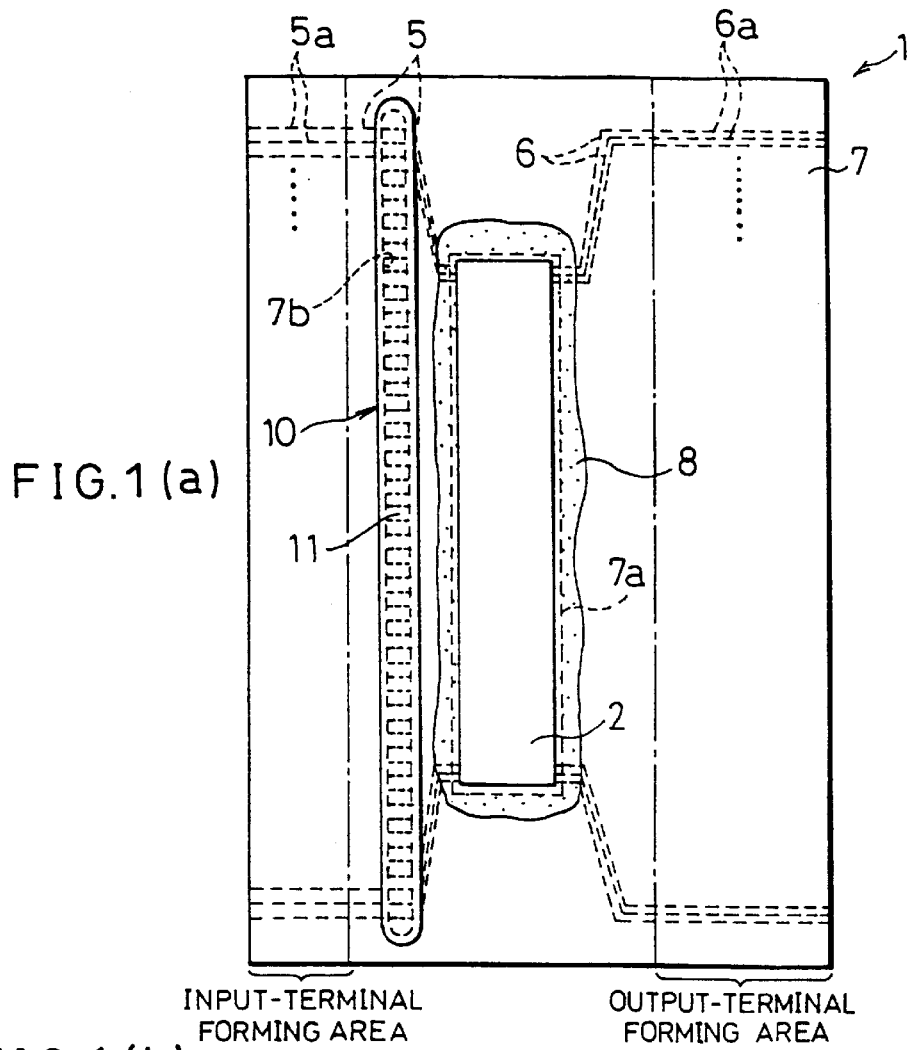
FIGS. 1(a) and 1(b) referring to a tape carrier package (a mounted substrate) of an embodiment in accordance wit the present invention.

As shown in FIG. 1(a), a TCP 1 has a long, narrow and flat base film (insulating board) 7. The base film 7 is flexible and made of, for example, insulating resin. The base film 7 is 3.0 mm to 11 mm in width, 12 mm to 35 mm in length and, in a normal state, 75 µm in thickness. The standard width and length are 9 mm and 20 mm respectively.

The base film 7 has a device installment aperture 7a around its center. An LSI chip 2 (a drive element) is installed at the device installment aperture 7a. The LSI chip 2 is installed by a resin mold 8 and thus fixed to the device installment aperture 7a. The LSI chip 2 is 0.7 mm to 3.5 mm in width and 10 mm to 16 mm in length. The standard width and length are 1.5 mm and 13 mm respectively.

Input wiring patterns 5 and output wiring patterns 6 are made of conductor, such as copper foil, and provided on the back surface of the base film 7. An end of each input wiring pattern 5 is connected to each terminal of the LSI chip 2, while the other end of each input wiring pattern 5, extending to the left in FIG. 1(a), has an input terminal 5a. An end of each output wiring pattern 6 is connected to each terminal of the LSI chip 2, while the other end of each output wiring pattern 6, extending to the right in FIG. 1(a), has an output terminal 6a.

The input terminal 5a is provided in a area having a width of 0.5 mm to 2 mm: the standard width of the area is 1.5 mm. The output terminal 6a is provided in a area having a width of 1.3 mm to 3.5 mm: the standard width of the area is 3 mm. The distance between the input-side edge of the LSI chip 2 and the input-terminal forming area is 1.3 mm to 2 mm: the standard distance is 1.5 mm. So is the distance between the output-side edge of the LSI chip 2 and the output-terminal forming area.

The TCP 1 has a stress-absorbing portion 10 near the input-terminal side of the LSI chip 2. To be more precise, the stress-absorbing portion 10 is provided between the input-terminal forming area and an area in which the resin mold 8 is provided. The stress-absorbing portion 10 extends in a direction orthogonal to the input wiring patterns 5.

The stress-absorbing portion 10 is provided in the following manner. First, a part of the base film 7 between the input-terminal forming area and the area in which the the resin mold 8 will be provided is cut out. The cut-out portion is shown as 7b in FIG. 1(b). As a result, the input wiring patterns 5 are exposed in the cut-out portion 7b. Then, insulating resin (protecting resin) 11, such as polyimide resin and urethane resin, is applied from the front surface side for coating the exposed portion of the input wiring patterns 5. Therefore, the stress-absorbing portion 10 is more flexible than the base film 7 and gives flexibility to the TCP 1. Compared with an uncoated cut-out portion 7a, the cut-out portion 7b coated with the flexible insulating resin 11 have various advantages: (1) the input-terminal side of the TCP 1 less affected by a stress which is caused by thermal contraction of a PWB 4 (described later), (2) the input wiring patterns 5 reinforced, (3) the output terminal 6a less affected by a stress from a glass edge of a liquid crystal display panel 3 which is caused by a bent PWB 4, and therefore the output terminal 6a not cut off.

Note that it is known from a simulation using parameters (described later) that the width of the cut-out portion 7b must not be less than 0.3 mm.

Figure 1B:
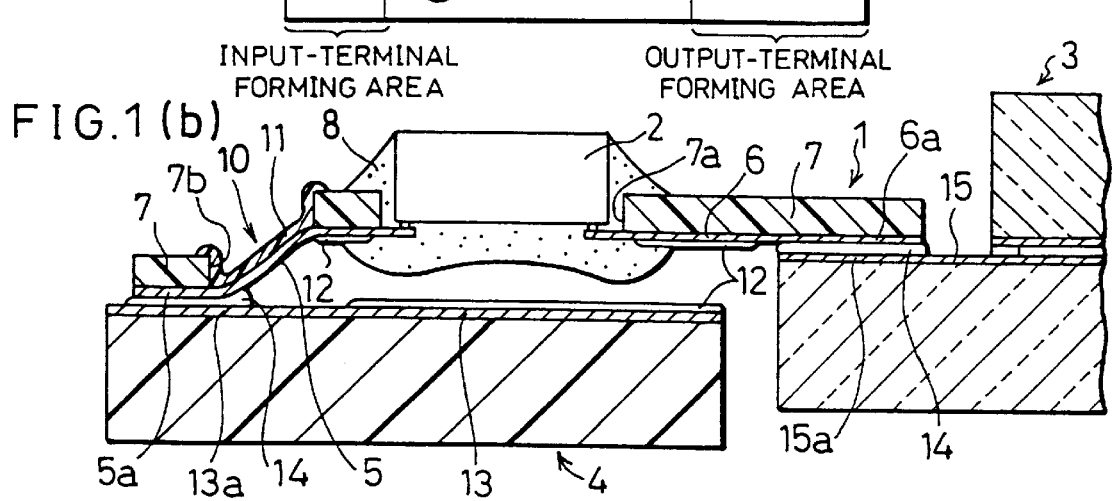

The TCP 1 is connected to both the liquid crystal display panel 3 and the PWB (the wiring board) 4 in the following way (see FIG. 1(b)).

Each of input terminals 15a provided at an end of each of electrode patterns 15 of the liquid crystal display panel 3 is electrically connected through an ACF (Anisotropic Conductive Film) 14 to each of the output terminals 6a of the TCP 1. To be more specific, the ACF 14 having a predetermined thickness is provided on the input terminal 15a of the liquid crystal display panel 3. Then, the TCP 1 is put on the ACF 14 so that each output terminal 6a of the TCP 1 is placed on each corresponding input terminal 15a of the liquid crystal display panel 3. Finally, the ACF 14 is heated and pressurized from the TCP 1 side by, for example, a heating tool to complete a process of connecting the TCP 1 and the liquid crystal display panel 3.

Next, in order to connect the TCP 1 and the PWB 4, each of output terminals 13a provided at an end of each of wiring patterns 13 of the PWB 4 is electrically connected through an ACF 14 to each of the input terminals 5a of the TCP 1. To be more specific, the ACF 14 having a predetermined thickness is provided on the output terminal 13a of the PWB 4. Then, the TCP 1 is put on the ACF 14 so that each input terminal 5a of the TCP 1 is placed on each corresponding output terminal 13a of the PWB 4. Finally, the ACF 14, being quite close to the resin mold 8 by which the LSI chip 2 is fixed, is heated and pressurized from the TCP 1 side by, for example, a heating tool to complete a process of connecting the TCP 1 and the PWB 4.

After the processes of connecting the TCP 1 to both the liquid crystal display panel 3 and the PWB 4, solder resist 12 is applied to coat portions of the input and output wiring patterns 5 and 6 which need to be insulated.

When the input-terminal side of the TCP 1 is heated very close to the resin mold 8 by which the LSI chip 2 is fixed, the base film 7 is pulled towards the input terminal 5a and causes a stress. Besides, the PWB 4, being heated and thus expanded in the heating-and-pressurizing connection process, is attached to the TCP 1. After the process is over and the PWB 4 is cooled down, the PWB 4 shrinks and bends. Therefore, the PWB 4 changes dimensions thereof and thus causes a stress in accordance with the dimension change.

A conventional slim TCP of high definition and multi-output is weak in structure because the conventional slim TCP has narrow wiring pitches and a small cross-sectional area of input and output wiring patterns. Therefore, the above mentioned stress would induce problems with such a slim TCP: for example, the input wiring pattern 5 cut off or twisted, the output terminal 6a cut off, the resin mold 8 peeling at the interface thereof and an inner lead cut off.

However, the TCP 1 is, as mentioned above, provided with the stress-absorbing portion 10 which absorbs the stress caused by the heating-and-pressurizing connection process of the PWB 4 and the TCP 1 (in other words, the stress caused by heating very close to the resin mold 8 and the stress in accordance with the dimension change of the PWB 4).

Consequently, even if the dimension change of the PWB 4 causes PWB 4 to bend and a stress is transmitted to the TCP 1, the stress caused by the bent PWB 4 is absorbed by the stress-absorbing portion 10. Therefore, the TCP 1 is free from distortion and deformation caused by the dimension change of the PWB 4, whereas a conventional TCP is not. The TCP 1 is thus free from the cut-off or twisting of the input wiring patterns 5. Besides, the output terminal 6a of the TCP 1 is not pressed against the glass edge of the liquid crystal display panel 3, and thus can be prevented from being cut off by the glass edge.

When the PWB 4 is connected to the input-terminal side of the TCP 1 by heating and pressurizing, it is possible to treat the TCP 1 as two portions separated by the stress-absorbing portion 10: namely, the LSI-chip 2 side and the input-terminal side. As a result, heating the neighborhood of the LSI chip 2 causes no stress pulling the LSI-chip 2 side of the base film 7 towards the input-terminal side thereof. Thus, the resin mold 8 is prevented from peeling at an interface thereof, and the inner lead is prevented from being cut off.

Figure 3:
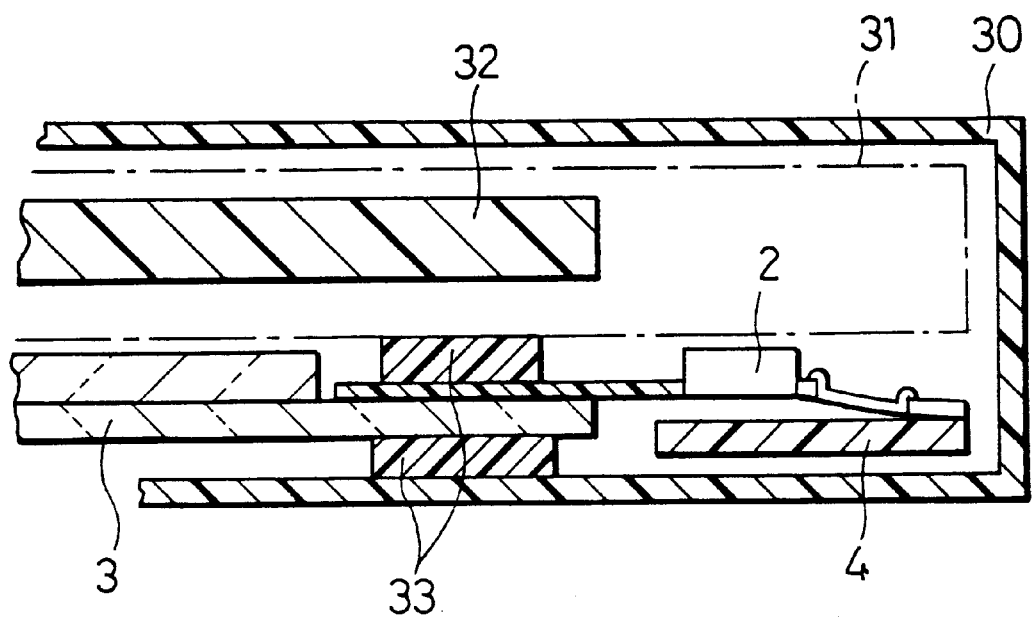
FIG. 3 is an enlarged cross-sectional view showing the area enclosed with a circle in FIG. 2(a).
Figure 4A:
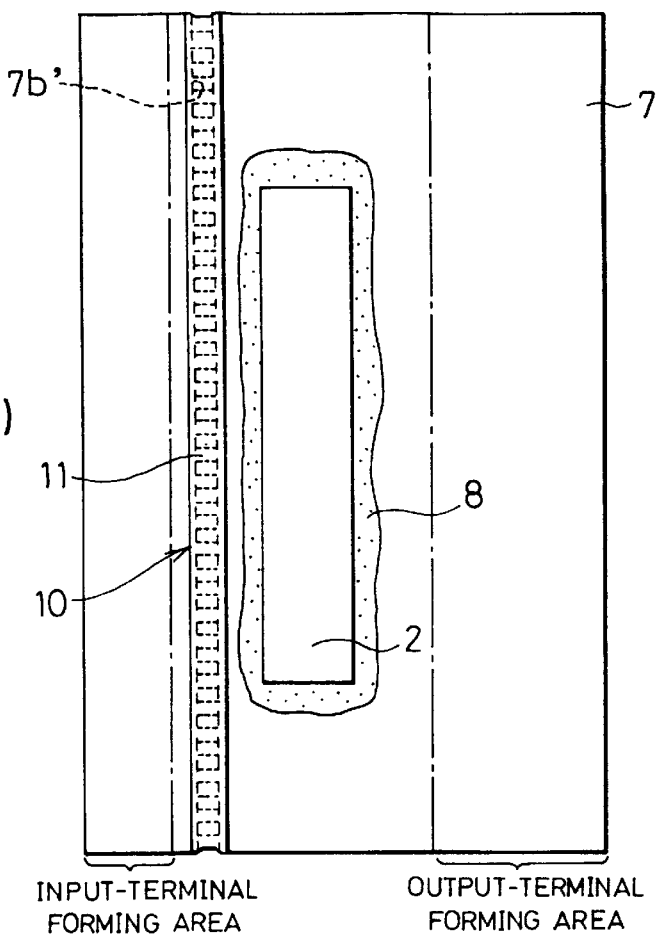
FIGS. 4(a) and 4(b) referring to a tape carrier package of another embodiment in accordance with the present invention.
Figure 4B:
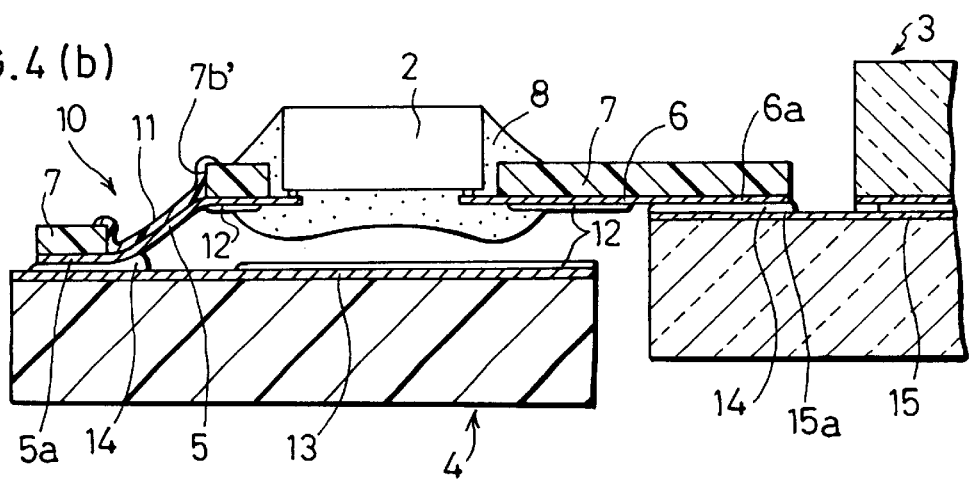

FIG. 2(b) is a plan view showing a liquid crystal module in which the liquid crystal display panel 3, the TCP 1 and the PWB 4 are connected so as to virtually form one flat plane. FIG. 3 is an enlarged cross-sectional view of the area enclosed with a circle in FIG. 2(a) showing the TCP 1 and the PWB 4 connected to each other in the liquid crystal module. Referring to FIGS. 2(a), 2(b) and 3, the member 30 is a bezel case; the member 31 is a plastic chassis; the member 32 is a light guiding plate of a backlight; the member 33 is a spacer; the member 34 is a cold cathode tube for the backlight.

As explained above, the TCP 1 of the present embodiment makes it possible to arrange the liquid crystal display panel 3 of high definition and a great number of pixels so that the liquid crystal display panel 3, the TCP 1 and the PWB 4 virtually form one flat plane. Consequently, it is possible to produce a thin liquid crystal module with a high area ratio of the available display area (shown as a rectangle of alternate long and short dash lines A in FIG. 2(b)). Such a liquid crystal module can be used, for example, as a color liquid crystal module of high definition and a great number of pixels.

The foregoing arrangement of the TCP 1 can make the TCP of high definition and multi-output slimmer, thus it is possible to obtain more TCPs out of a film carrier and thus to cut costs. To be more specific, compared with a conventional bent TCP, the TCP of the present embodiment can reduce amount of tape carrier necessary for one TCP by 3 to 4 perforation. Besides, a duty drive color LCD module uses 25 to 30 TCPs. Therefore, it is possible to cut costs greatly.

Here is a list showing the above mentioned parameters which determine the width of the cut-out portion 7b. The parameter (18) is used only when necessary and is related with a third embodiment (described later):

(1) The heating temperature of the connecting part.

(2) The coefficient of thermal expansion of the base film.

(3) The coefficient of thermal conductivity of the TCP (including affection from the electrodes).

(4) The thickness of the base film.

(5) The flexural strength of the base film.

(6) The elastic modulus of the base film (modulus of transverse elasticity/modulus of volume elasticity).

(7) The copper thickness/the width of the wiring patterns.

(8) The flexural strength of copper.

(9) The shear strength of copper.

(10) The bending strength of copper.

(11) The coefficient of thermal expansion of the PWB material.

(12) The coefficient of thermal conductivity of the PWB (including affection from the electrodes).

(13) The thickness of the PWB material.

(14) The flexural strength of the PWB material.

(15) The elastic modulus of the PWB material (modulus of transverse elasticity/modulus of volume elasticity).

(16) The flexural strength of the coating resin.

(17) The elastic modulus of the coating resin (modulus of transverse elasticity/modulus of volume elasticity).

(18) The thickness of the base film after being half-etched.

(19) The peel strength of the mold resin.

(20) The dimension of the cut-out portion.

(21) The distance between the connecting point to the cut-out portion.

In the present embodiment, the cut-out portion 7b has a slit shape. However, it is also possible to cut out a portion of a base film 7 all along the longer edge of the base film 7 so that the cut-out portion reaches the shorter edges of the base film 7. Such a type of cut-out portion is shown as a cut-out portion 7b' in FIGS. 4(a) and 4(b).

Figure 5A:
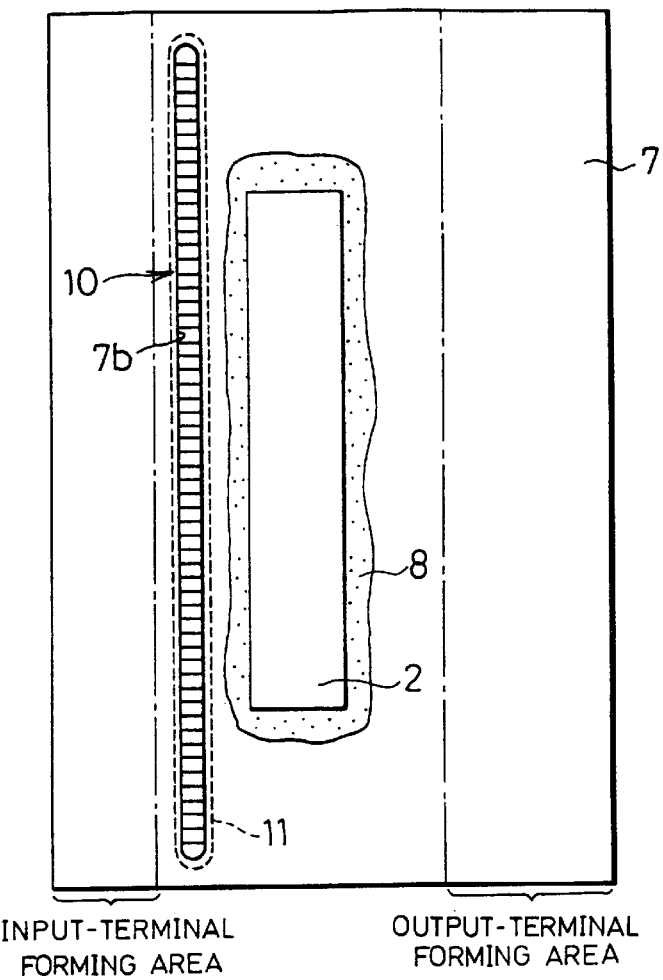
FIGS. 5(a) and 5(b) referring to a tape carrier package of a further embodiment in accordance with the present invention.
Figure 5B:
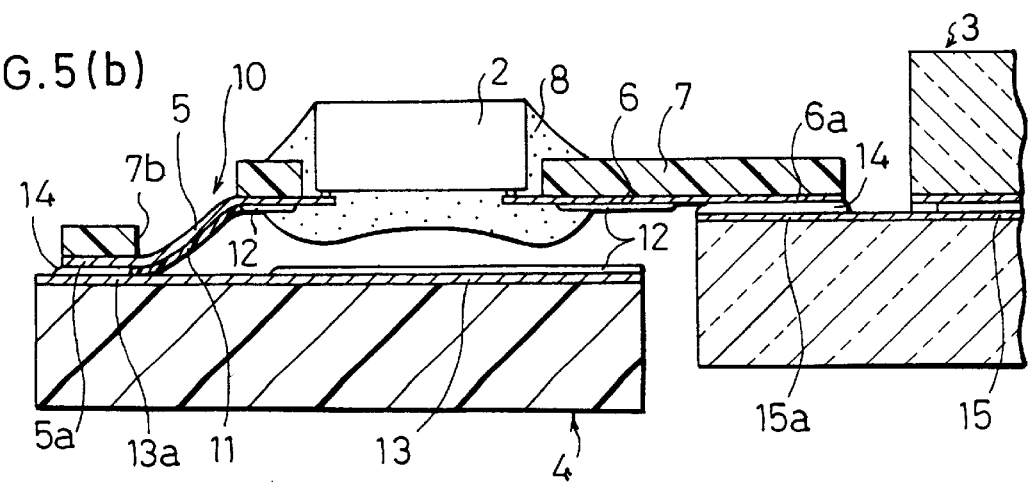
Figure 6A:
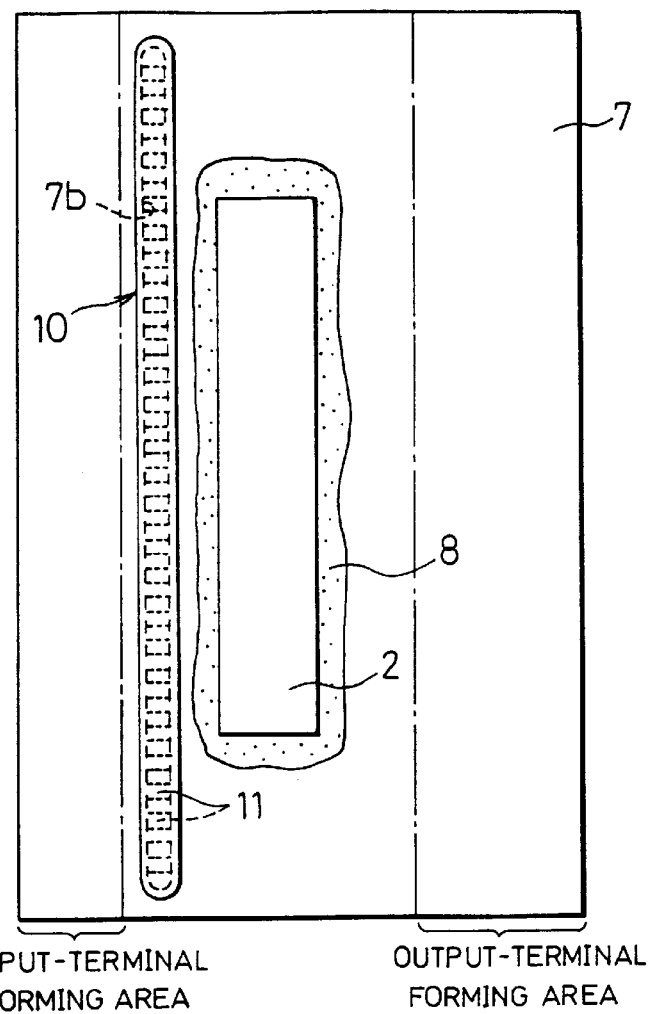
FIGS. 6(a) and 6(b) referring to a tape carrier package of a still further embodiment in accordance with the present invention.
Figure 6B:
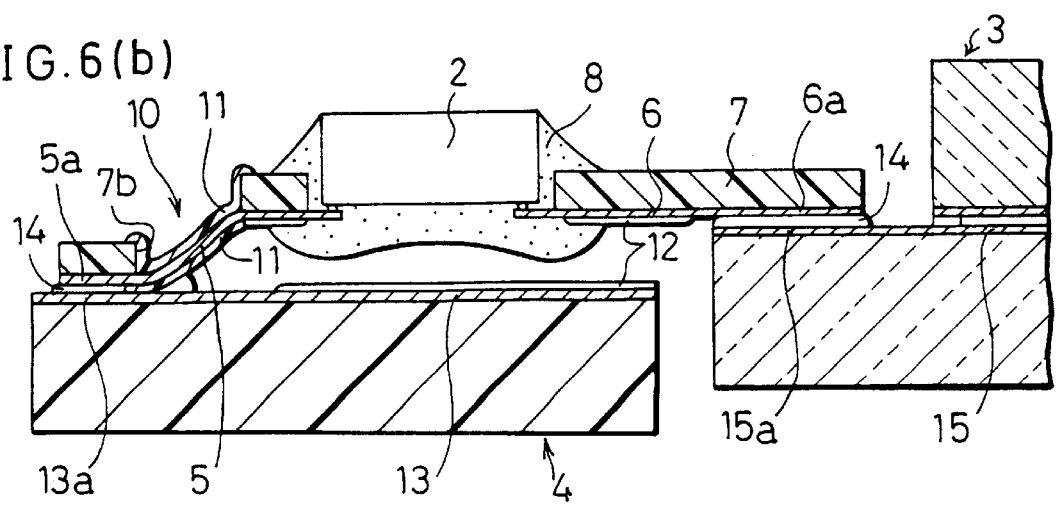

In the present embodiment, the insulating resin 11 is applied to the front surface of the cut-out portion 7b. However, it is also possible to apply the insulating resin 11 to the back surface of the cut-out portion 7b as shown in FIGS. 5(a) and 5(b). It is even possible to apply the insulating resin 11 to both the front surface and the back surface of the cut-out portion 7b as shown in FIGS. 6(a) and 6(b). The TCPs shown in FIGS. 1 (a), 4(a) and 5(a) are 4 times as strong against a stress as a conventional TCP with no stress-absorbing portion 10. Therefore, the TCP shown in FIG. 6(a) should be even stronger.

The width of the cut-out portion 7b can be anywhere not less than 0.3 mm. In the present embodiment, the cut-out portion 7b is provided in the neighborhood of the LSI chip 2 between the LSI chip 2 and the input-terminal forming area. However, it is also possible to cut out a portion of the base film 7 so that the cut-out portion partly overlaps with the input-terminal forming area and/or reaches to a cutting edge of the base film 7. Details will be described in a second embodiment.

It is also possible to provide the stress-absorbing portion 10 on the output-terminal side as well as on the input-terminal side. Details will be described in a second embodiment.

SECOND EMBODIMENT

Referring to FIGS. 7 through 14, the following description will discuss another embodiment in accordance with the present invention. Here, for convenience, members of the second embodiment that have the same function as members of the above embodiment, and that are mentioned in the above embodiment are indicated by the same reference numerals and description thereof is omitted.

A TCP 20 of the present embodiment shown in FIGS. 7(a) and 7(b) has the following differences from the TCP 1 of the above embodiment shown in FIG. 1. Namely, a cut-out portion 7c is provided on the output-terminal side and coated with insulating resin 11 so as to provide another stress-absorbing portion 10.

The above mentioned stress from the input-terminal side can affect the output-terminal side in a very slim TCP. However, the stress-absorbing portion 10 provided on the output-terminal side can further reduce affection from a PWB 4 which is bent upon being connected to the TCP 20. Thus, the stress-absorbing portion 10 provided on the output-terminal side can more effectively prevent the TCP 20 from being pressed against a glass edge of a liquid crystal display panel 3.

Figure 8:
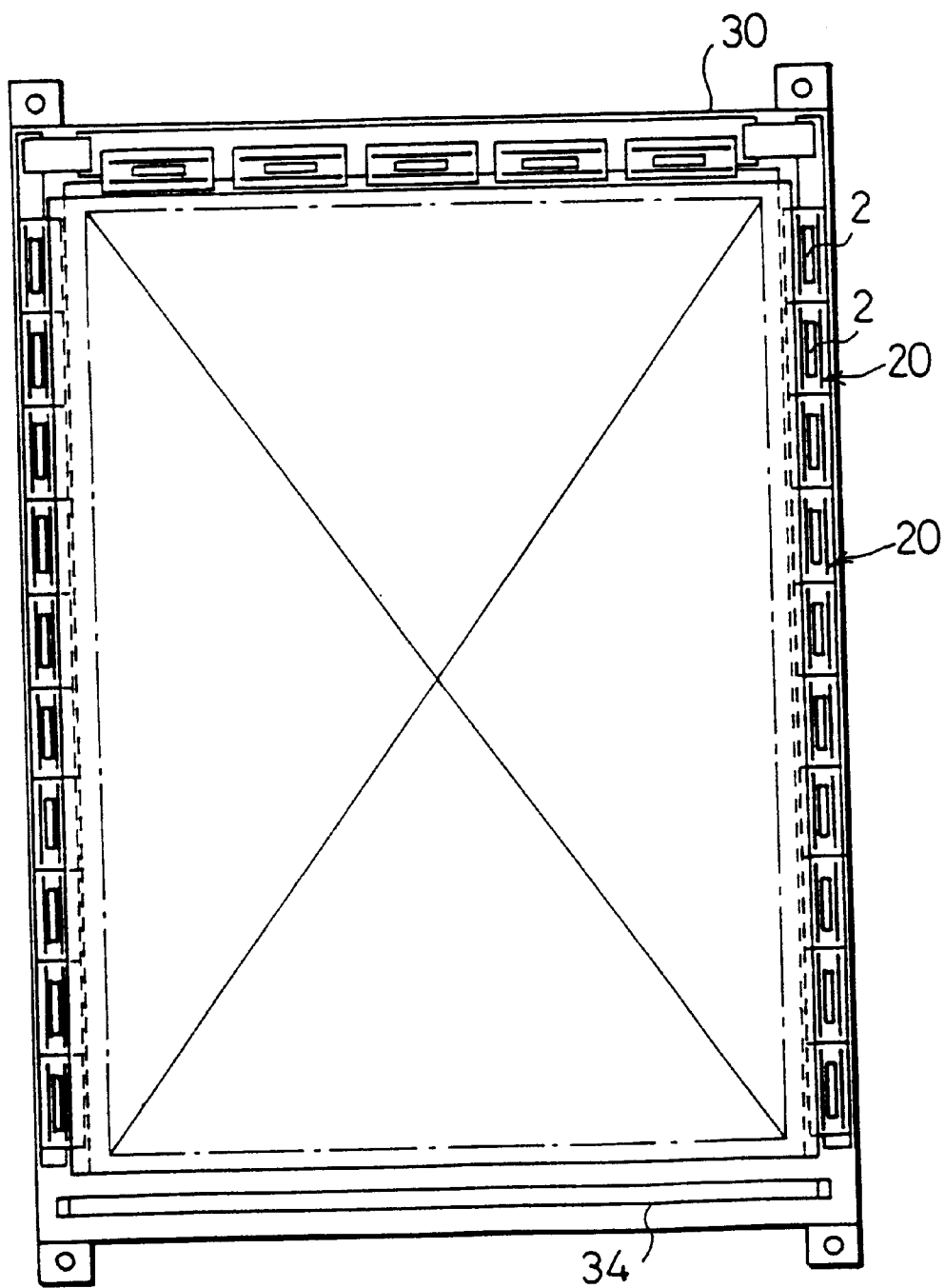
FIG. 8 is a plan view showing a liquid crystal module including a liquid crystal display panel connected to the tape carrier package.

FIG. 8 is a plan view showing a liquid crystal module in which the liquid crystal display panel 3, the TCP 20 and the PWB 4 are connected so as to virtually form one flat plane.

Figure 9A:
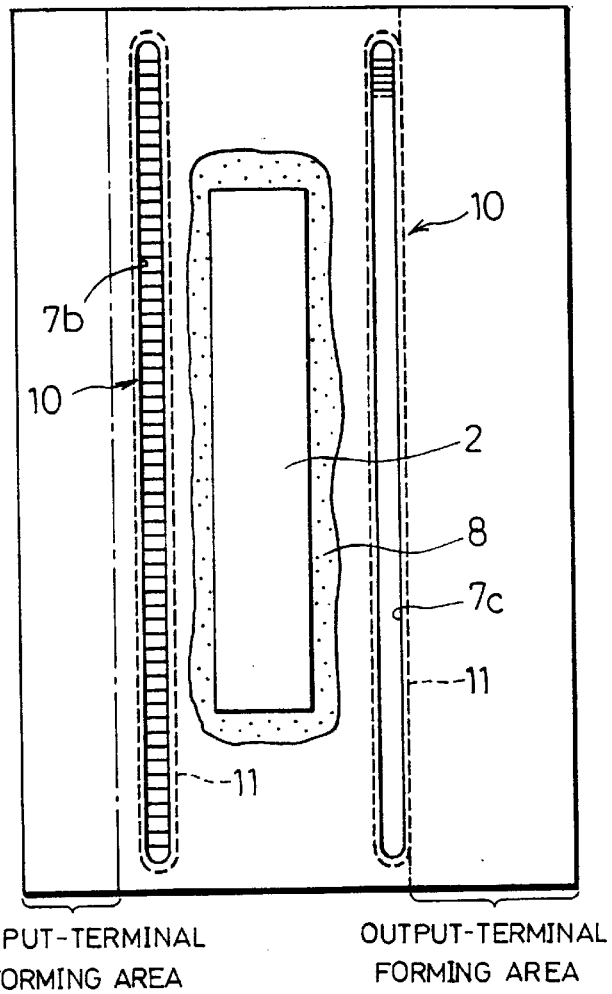
FIGS. 9(a) and 9(b) referring to a tape carrier package of a still further embodiment in accordance with the present invention.
Figure 9B:
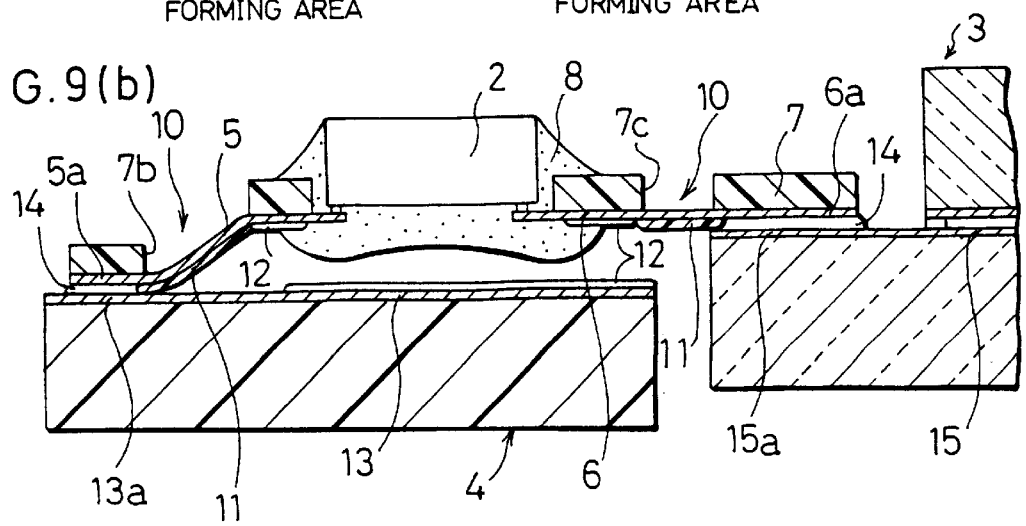
Figure 10A:
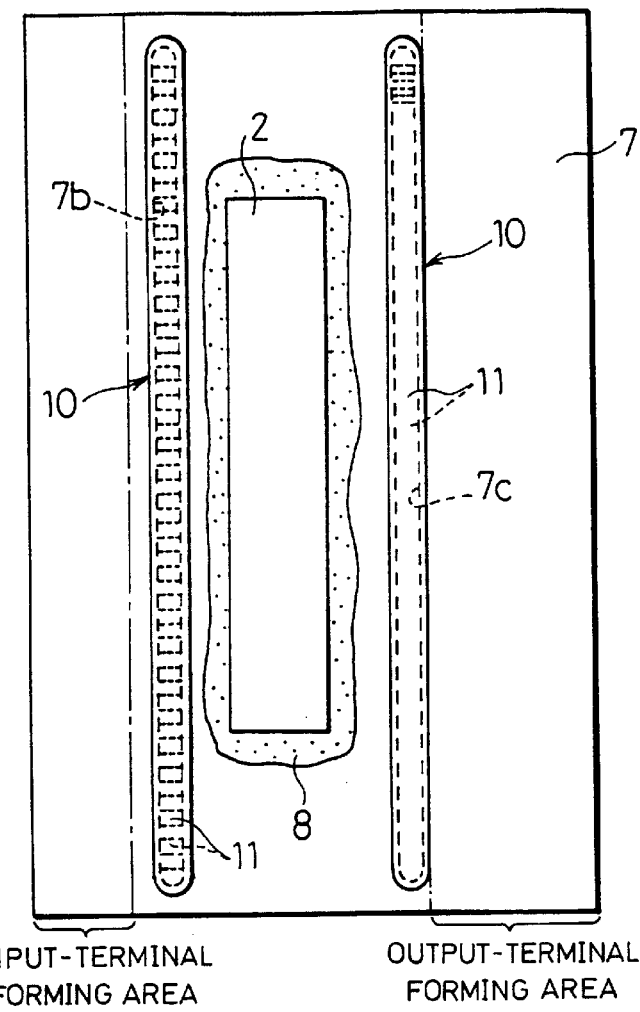
FIGS. 10(a) and 10(b) referring to a tape carrier package of a still further embodiment in accordance with the present invention.
Figure 10B:
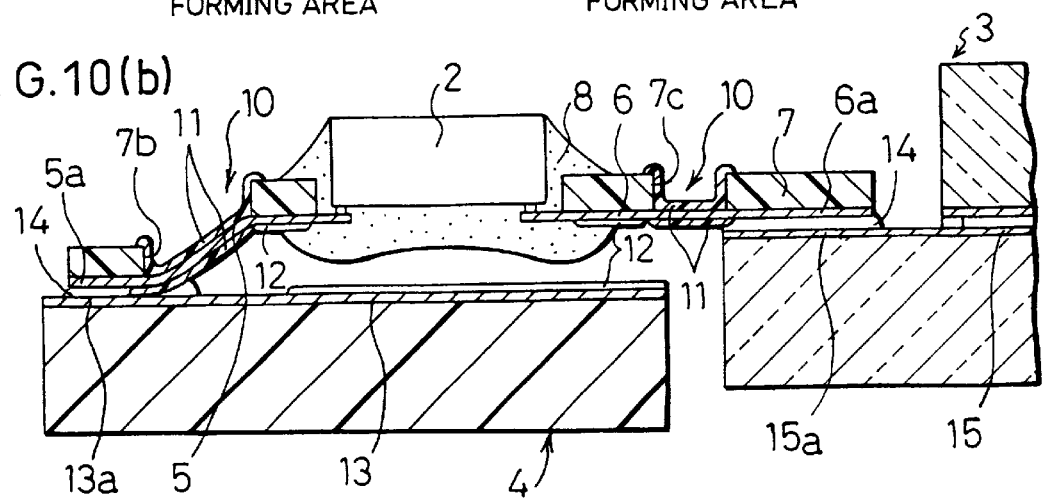

In the above embodiment, the insulating resin 11 is applied to the front surface of the cut-out portions 7b and 7c. However, it is also possible to apply the insulating resin 11 to the back surface as shown in FIGS. 9(a) and 9(b). It is even possible to apply the insulating resin 11 to both the front surface and the back surface as shown in FIGS. 10(a) and 10(b).

Figure 11:
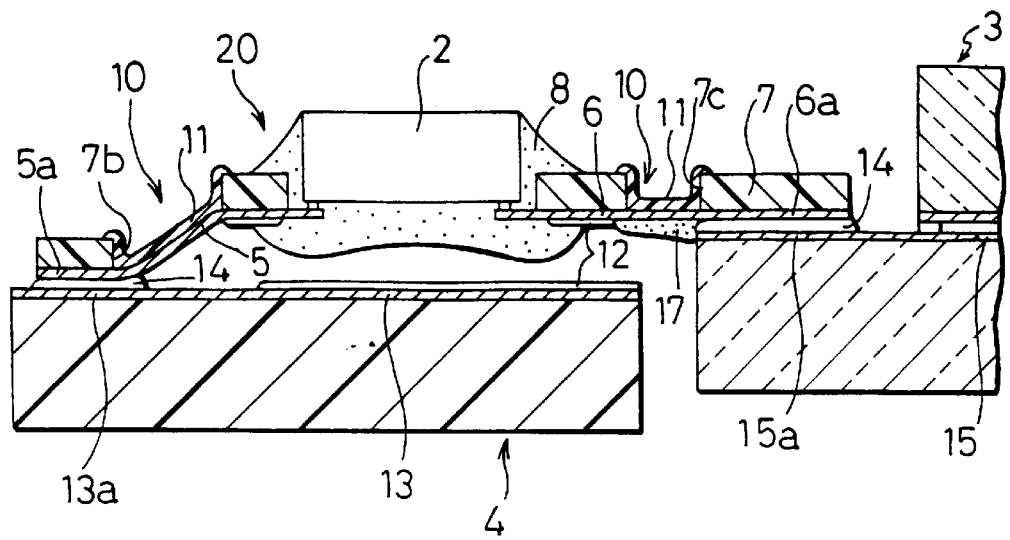
FIG. 11, referring to a still further embodiment, is a cross-sectional view showing the tape carrier package shown in FIG. 7(a) connected to both a liquid crystal display panel and a print wiring board.

Moreover, as shown in FIG. 11, it is also possible to modify in the following manner the TCP 20 shown in FIG. 7(a) in which the insulating resin 11 is applied only to the front surface of the cut-out portions 7b and 7c. Namely, flexible insulating resin 17 is additionally applied to a predetermined portion of output wiring patterns 6 provided on the back surface of a base film 7. The insulating resin 17 is applied in an assembly process of the liquid crystal module after the insulating resin 11 is applied. The insulating resin 17 can more effectively prevent the TCP 20 from being pressed against a glass edge of the liquid crystal display panel 3.

Figure 12:
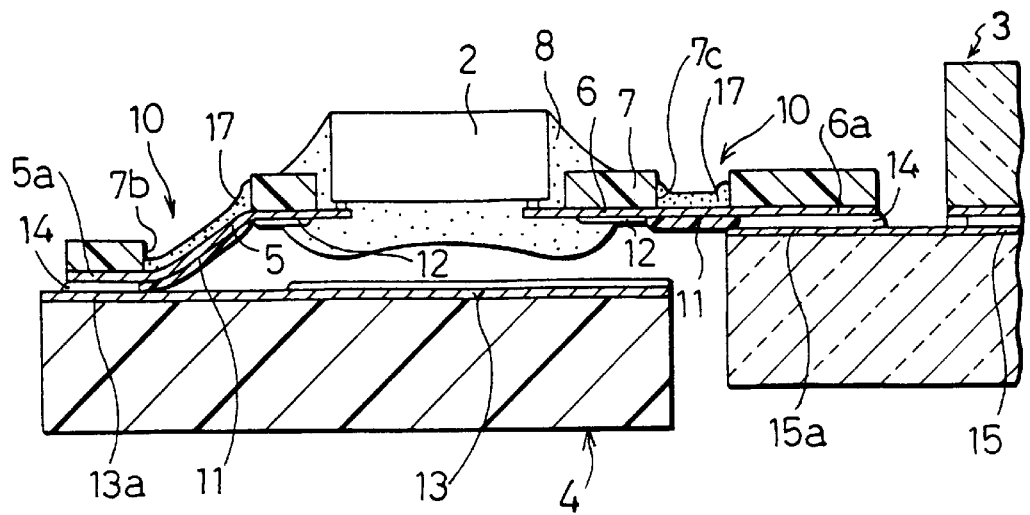
FIG. 12, referring to a still further embodiment, is a cross-sectional view showing the tape carrier package shown in FIG. 9(a) connected to both a liquid crystal display panel and a print wiring board.
Figure 13A:
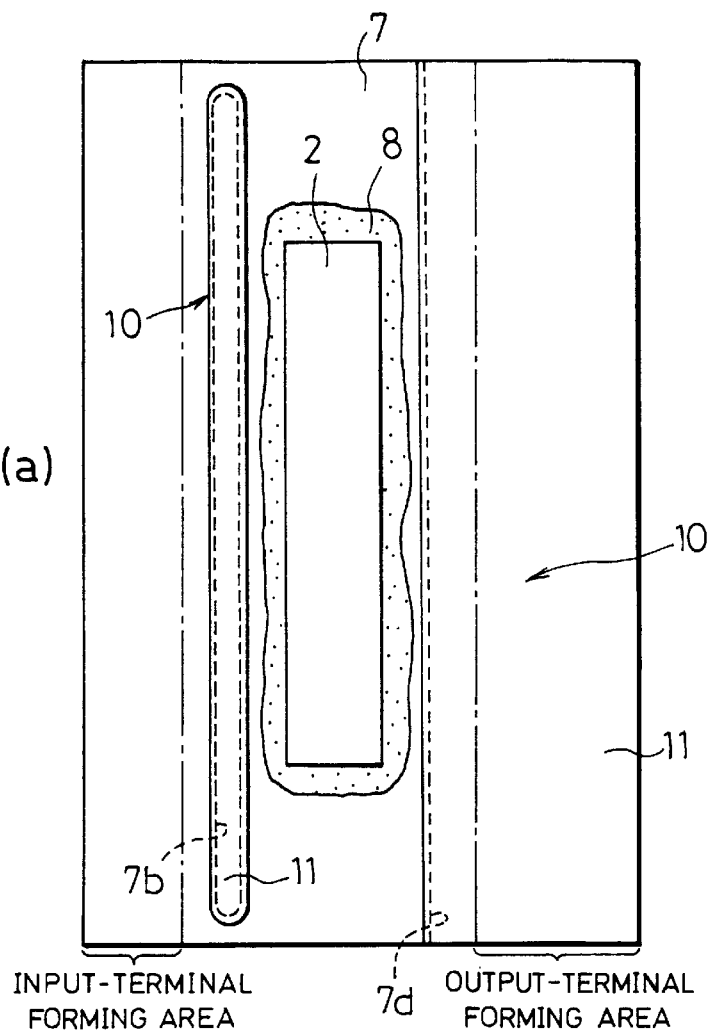
FIGS. 13(a) and 13(b) referring to a tape carrier package of a still further embodiment in accordance with the present invention.
Figure 13B:
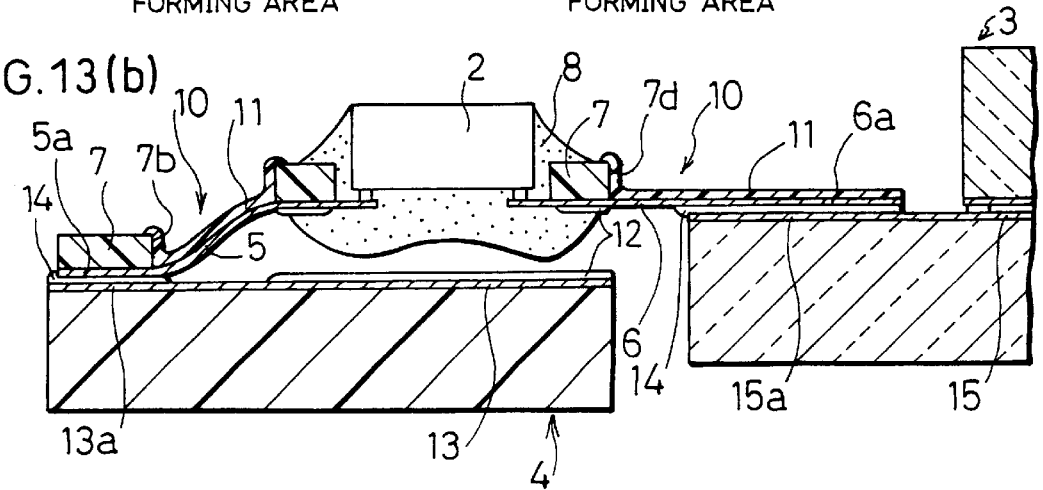

Moreover, as shown in FIG. 12, it is also possible to modify in the following manner the TCP shown in FIG. 9(a)

in which the insulating resin 11 is applied only to the back surface of the cut-out portions 7b and 7c. Namely, flexible insulating resin 17 is additionally applied to a predetermined portion of input and output wiring patterns 5 and 6 provided on the front surface of a base film 7. The insulating resin 17 is applied in an assembly process of a liquid crystal module after the insulating resin 11 is applied.

Moreover, it is also possible to modify in the following manner the TCP 20 of the above embodiment wherein the cut-out portion 7c serving as the stress-absorbing portion 10 on the output-terminal side is provided in the neighborhood of the LSI chip 2 between the LSI chip 2 and the output-terminal forming area. Namely, the cut-out portion 7c is widened to partly overlap with an output-terminal and/or is extended to reach a cutting edge of the base film 7. The extended cut-out portion is shown as a cut-out portion 7d in FIGS. 13(a) and 13(b). Insulating resin 11 is applied to the front surface of the cut-out portion 7d.

Moreover, in addition to the cut-out portion 7d, it is possible to modify the cut-out portion 7b serving as the stress-absorbing portion 10 on the input-terminal side as shown in FIGS. 14(a) and 14(b). Namely, the cut-out portion 7b is, in order to provide a cut-out portion 7e, extended to reach a cutting edge of the base film 7. Alternatively, it is also possible to only extend the cut-out portion 7b.

THIRD EMBODIMENT

Referring to FIG. 15, the following description will discuss another embodiment in accordance with the present invention. Here, for convenience, members of the third embodiment that have the same function as members of the above embodiments, and that are mentioned in the above embodiments are indicated by the same reference numerals and description thereof is omitted.

Figure 15A:
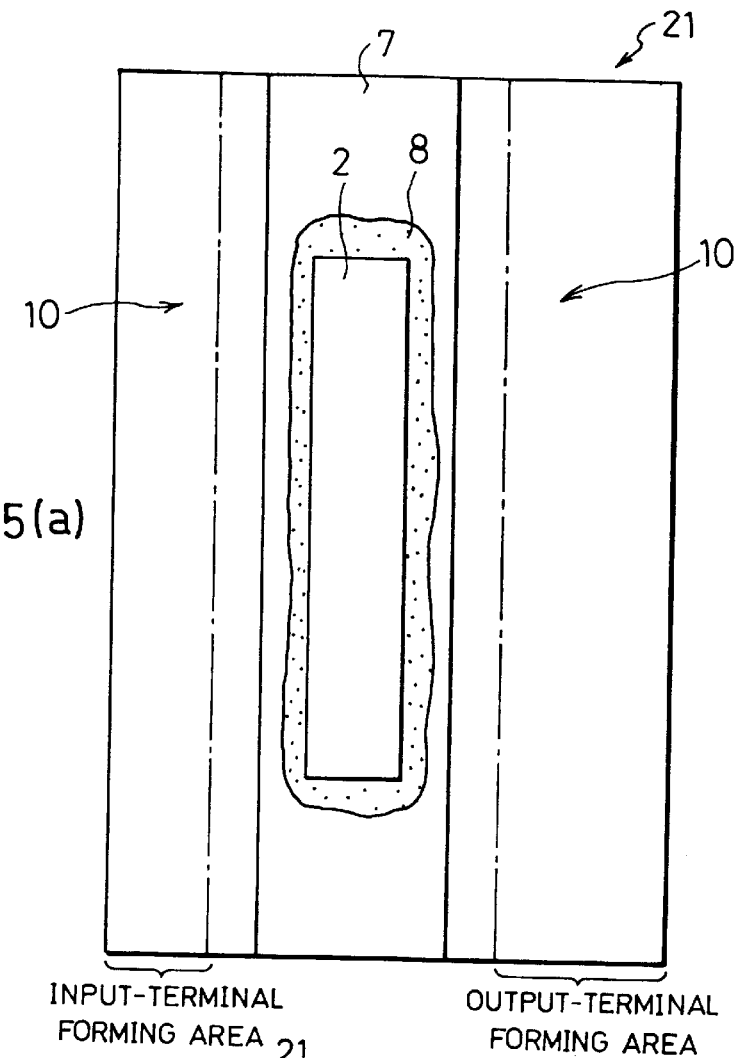
FIGS. 15(a) and 15(b) referring to a tape carrier package of a still further embodiment in accordance with the present invention.
Figure 15B:
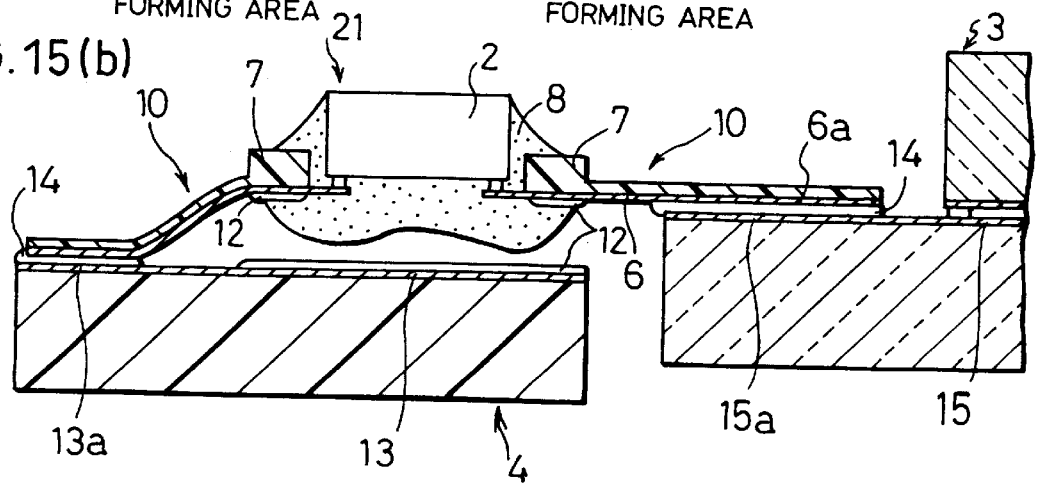
Figures 16A, 16B:
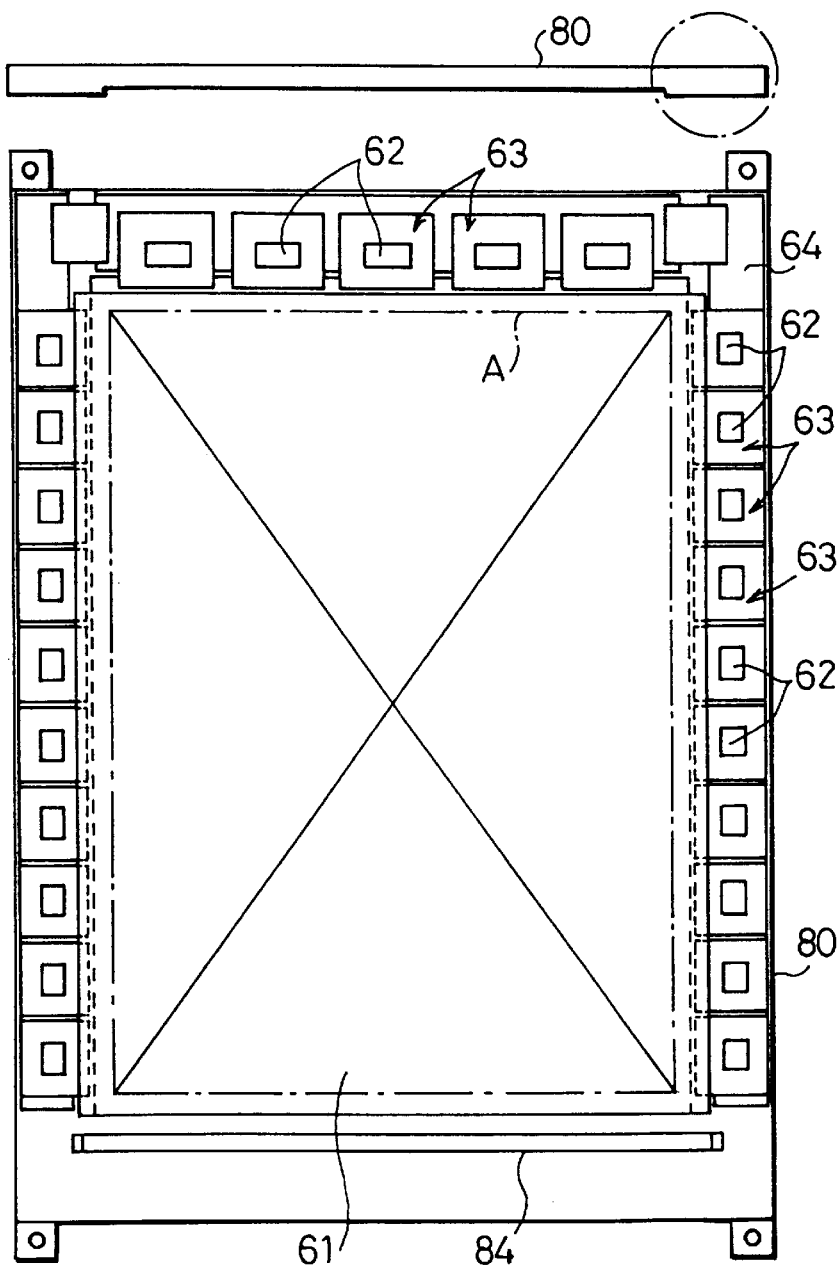
FIGS. 16(a) and 16(b) are, respectively, a side view and a plan view showing a liquid crystal module including a liquid crystal display panel connected to a conventional tape carrier package.
Figure 17:
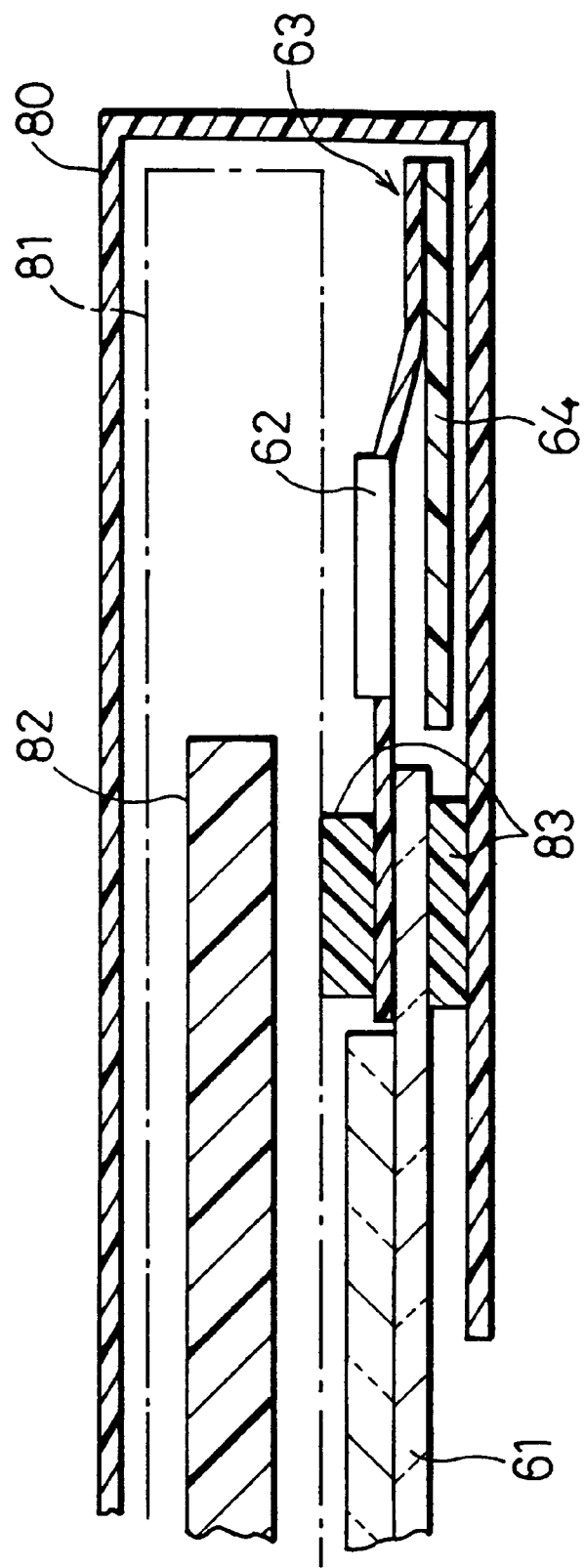
FIG. 17 is an enlarged cross-sectional view showing the area enclosed with a circle in FIG. 16(a).
Figure 18A:
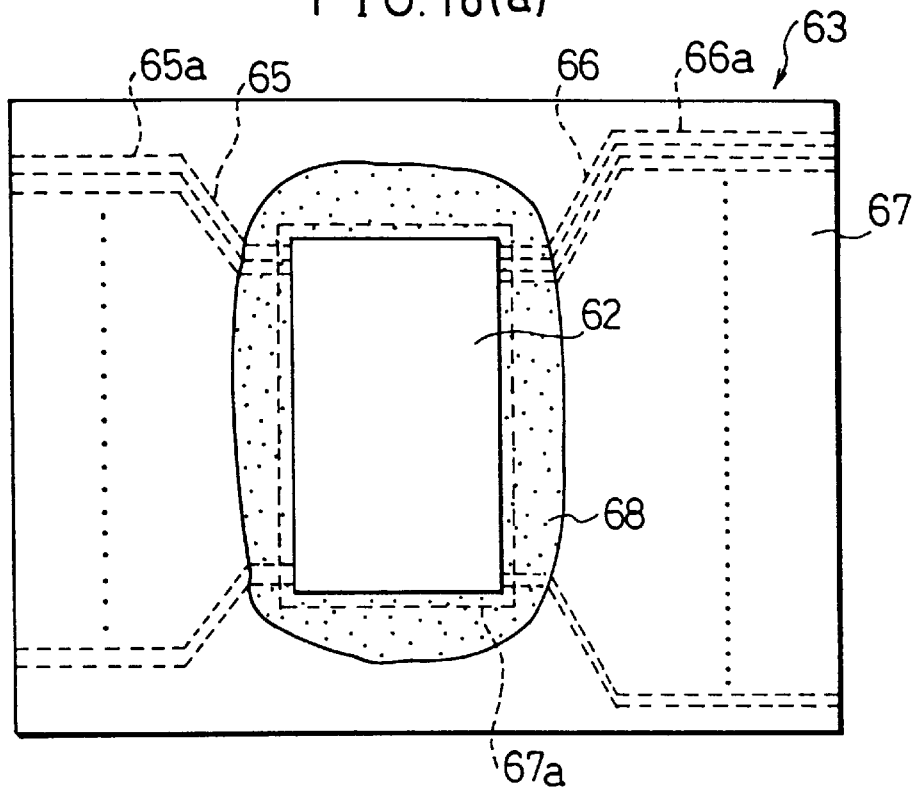
FIGS. 18(a) and 18(b) referring to a conventional tape carrier package.
Figure 18B:
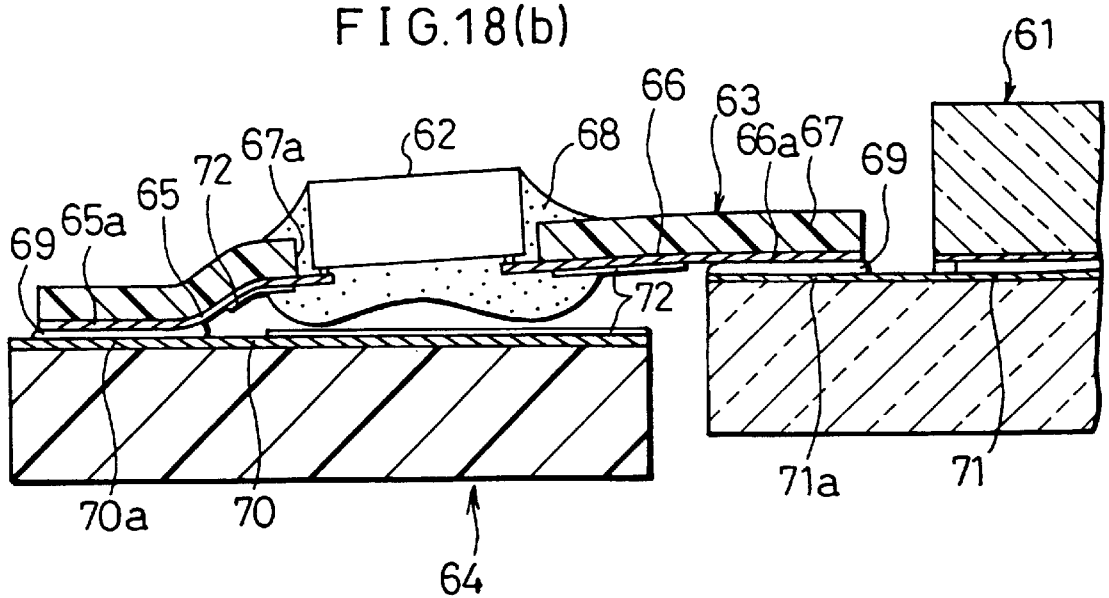
Figures 19A, 19B:
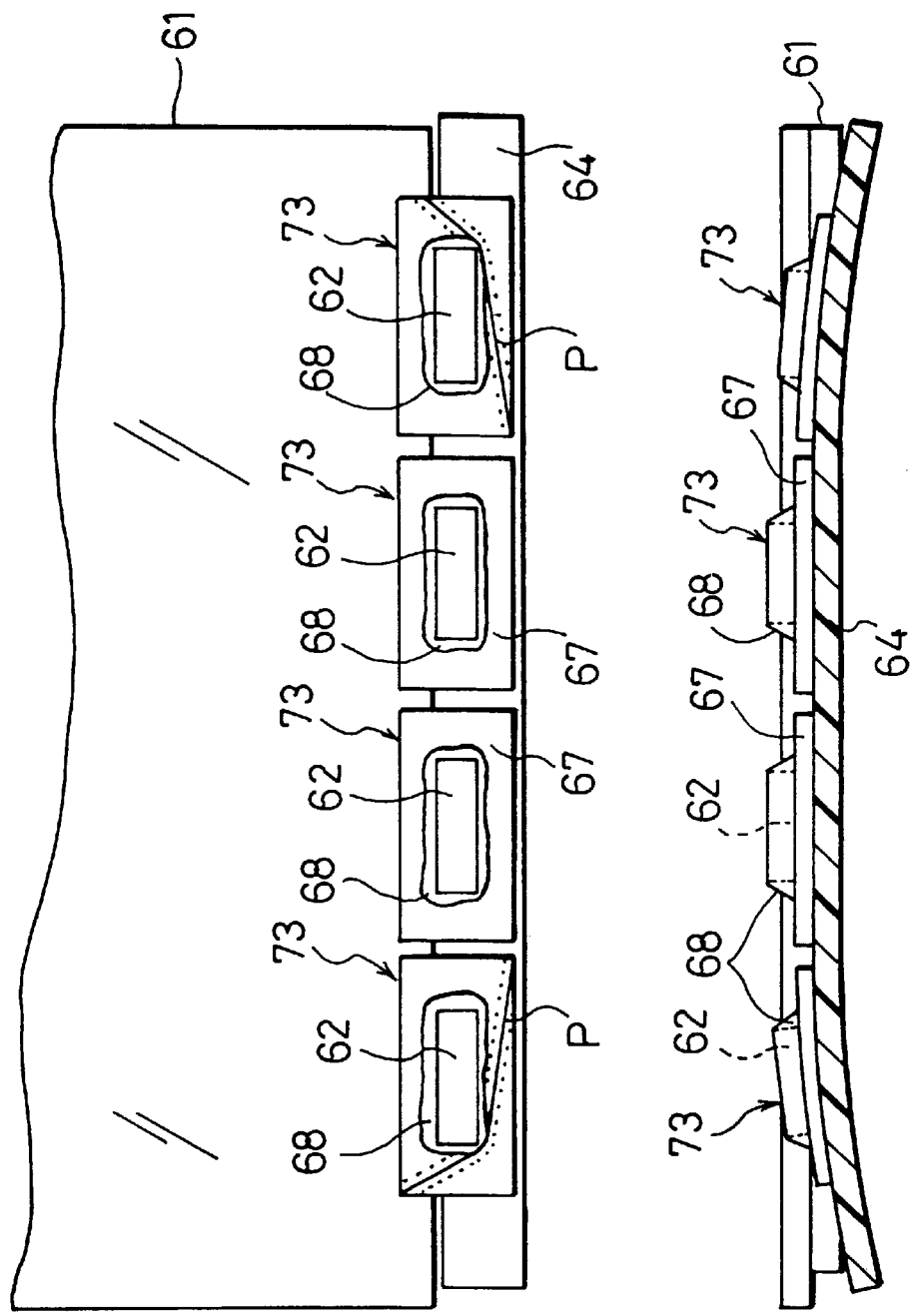
FIGS. 19(a) and 19(b) are explanatory drawings showing that conventional tape carrier packages on the ends of a print wiring board are distorted and deformed by the bent print wiring board. The bent of the print wiring board is caused by, for example, thermal contraction thereof which occurs when the print wiring board is connected to an input terminal of the tape carrier package through a film such as an anisotropic conductive film.

A TCP 21 of the present embodiment has stress-absorbing portions 10 on both the input terminal side and the output-terminal side as shown in FIGS. 15(a) and 15(b). However, the stress-absorbing portions 10 are provided by making portions of a base film 7 thin instead of cutting out portions of the base film 7. The thin portions of the base film 7 is provided by half-etching the front surface of the base film 7 between a neighborhood of an LSI chip 2 on the base film 7 and the edges of the base film 7 both on the input-terminal side and on the output-terminal side.

To be more specific, the base film 7 has a thickness of 75 μm, whereas the etched portions has a thickness of 25 μm. The etched portions gives flexibility to the base film 7. The etched portions have the same effect as a cut-out portion coated with insulating resin.

If the half-etching process is carried out by a method, such as mechanical grinding method, a sand blasting method, an ice blasting method or a laser etching method, the half-etching process can be incorporated into a manufacturing process of a tape carrier from which a TCP and a base film is made.

In the present embodiment, the front surface of the base film 7 is half-etched between the neighborhood of the LSI chip 2 on the base film 7 and the edges of the base film 7 both on the input-terminal side and on the output-terminal side. However, it is also possible to half-etch portions of the base film 7 between the neighborhood of the LSI chip 2 and either an input-terminal forming area or an output-terminal forming area. It is also possible to half-etch any portion between the input-terminal forming area and the longer edge of the base film 7 on the input-terminal side, or any portion between the output-terminal forming area and the longer edge of the base film 7 on the output-terminal side.

Moreover, a TCP can be provided with a half-etched portion either on the input-terminal side or on the output-terminal side. Besides, a TCP, needless to say, can be provided with the half-etched portion in combination with such cut-out portions coated with the insulating resin as in the first and second embodiments.

The invention being thus described, it will be obvious that the same may be varied in many ways. Such variations are not to be regarded as a departure from the spirit and scope of the invention, and all such modifications as would be obvious to one skilled in the art intended to be include within the scope of the following claims.

What is claimed is:

1. A mounted substrate provided without being folded between a flat display and a wiring board, comprising:
   a flexible insulating board, provided on one surface thereof with wiring patterns for connecting terminals of a drive element to terminals of the flat display and terminals of the wiring board, having an aperture for installment of the drive element; and
   a stress-absorbing portion more flexible than said insulating board, provided to be substantially orthogonal to the wiring patterns between a neighborhood of the drive element and an edge of said insulating board connected to the wiring board and/or between a neighborhood of the drive element and an edge of said insulating board connected to the flat display, for absorbing stress caused by a connection of the drive element to the flat display and the wiring board;
   wherein said stress-absorbing portion includes a cut-out portion where a part of said insulating board is cut out, said cut-out portion extending almost orthogonally to the wiring patterns having a width of not less than 0.3 mm.

2. The mounted substrate as defined in claim 1, wherein the flat display is a liquid crystal display panel.

3. The mounted substrate as defined in claim 1, wherein said insulating board is connected through an anisotropic conductive film to the wiring board.

4. The mounted substrate as defined in claim 1, wherein said stress-absorbing portion is provided to said insulating board in a whole area between the neighborhood of the drive element and the edge of said insulating board connected to the wiring board, or in a part of the area.

5. The mounted substrate as defined in claim 4, wherein said stress-absorbing portion is formed by providing a front surface of wiring patterns on the cut-out portion with a protection resin which is able to absorb stress caused by heating and pressurizing.

6. The mounted substrate as defined in claim 4, wherein said stress-absorbing portion is formed by provided a back surface of wiring patterns on the cut-out portion with a protection resin which is able to absorb stress caused by heating and pressurizing.

7. The mounted substrate as defined in claim 4, wherein said stress-absorbing portion is formed by providing both front and back surfaces of wiring patterns on the cut-out portion with a protection resin which is able to absorb stress caused by heating and pressurizing.

8. The mounted substrate as defined in claim 1, wherein said stress-absorbing portion is provided to said insulating board in a whole area between the neighborhood of the drive element and the edge of said insulating board connected to the flat display, or in a part of the area.

9. The mounted substrate as defined in claim 8, wherein said stress-absorbing portion is formed by providing a front surface of wiring patterns on the cut-out portion with a protection resin which is able to absorb stress caused by heating and pressurizing.

10. The mounted substrate as defined in claim 8, wherein said stress-absorbing portion is formed by provided a back surface of wiring patterns on the cut-out portion with a protection resin which is able to absorb stress caused by heating and pressurizing.

11. The mounted substrate as defined in claim 8, wherein said stress-absorbing portion is formed by providing both front and back surfaces of wiring patterns on the cut-out portion with a protection resin which is able to absorb stress caused by heating and pressurizing.

12. The mounted substrate as defined in claim 1, wherein there are a plurality of stress-absorbing portions provided on said insulating board both in a whole area between the neighborhood of the drive element and the edge of said insulating board connected to the wiring board and in a whole area between the neighborhood of the drive element and the edge of said insulating board connected to the flat display, or in parts of the areas.

13. The mounted substrate as defined in claim 12, wherein at least one of said stress-absorbing portions is formed by providing a front surface of wiring patterns on the cut-out portion with a protection resin which is able to absorb stress caused by heating and pressurizing.

14. The mounted substrate as defined in claim 12, wherein at least one of said stress-absorbing portions is formed by provided a back surface of wiring patterns on the cut-out portion with a protection resin which is able to absorb stress caused by heating and pressurizing.

15. The mounted substrate as defined in claim 12, wherein at least one of said stress-absorbing portions is formed by providing both front and back surface of wiring patterns on the cut-out portion with a protection resin which is able to absorb stress caused by heating and pressurizing.

\* \* \* \* \*